(12) United States Patent
Huang et al.

(10) Patent No.: US 12,125,903 B2
(45) Date of Patent: Oct. 22, 2024

(54) HIGH ELECTRON MOBILITY TRANSISTOR AND METHOD FOR FABRICATING THE SAME

(71) Applicant: UNITED MICROELECTRONICS CORP., Hsin-Chu (TW)

(72) Inventors: Shin-Chuan Huang, Tainan (TW); Chih-Tung Yeh, Taoyuan (TW); Chun-Ming Chang, Kaohsiung (TW); Bo-Rong Chen, Hsinchu County (TW); Wen-Jung Liao, Hsinchu (TW); Chun-Liang Hou, Hsinchu County (TW)

(73) Assignee: UNITED MICROELECTRONICS CORP., Hsin-Chu (TW)

( * ) Notice: Subject to any disclaimer, the term of this patent is extended or adjusted under 35 U.S.C. 154(b) by 0 days.

(21) Appl. No.: 18/371,440

(22) Filed: Sep. 21, 2023

(65) Prior Publication Data
US 2024/0014310 A1    Jan. 11, 2024

Related U.S. Application Data

(60) Continuation of application No. 17/575,655, filed on Jan. 14, 2022, now Pat. No. 11,804,544, which is a
(Continued)

(30) Foreign Application Priority Data

Jul. 9, 2019  (TW) .................................. 108124137

(51) Int. Cl.
*H01L 29/66*  (2006.01)
*H01L 21/265*  (2006.01)
(Continued)

(52) U.S. Cl.
CPC .... *H01L 29/7786* (2013.01); *H01L 21/26546* (2013.01); *H01L 29/2003* (2013.01);
(Continued)

(58) Field of Classification Search
CPC ............... H01L 29/2003; H01L 29/205; H01L 29/66462; H01L 29/7786; H01L 21/26546
See application file for complete search history.

(56) References Cited

U.S. PATENT DOCUMENTS 8,455,920 B2   6/2013   Bridger
8,916,908 B2   12/2014  Beach et al.
(Continued)

FOREIGN PATENT DOCUMENTS

JP    2013-140835 A    7/2013
TW      201810663 A    3/2018
(Continued)

OTHER PUBLICATIONS

Y. Cai et al., High-Performance Enhancement-Mode AlGaN/GaN HEMTs Using Fluoride-Based Plasma Treatment, Jul. 2005, IEEE Electron Device Letters, vol. 26, No. 7, pp. 435-437. (Year: 2005).*
(Continued)

*Primary Examiner* — Victoria K. Hall
(74) *Attorney, Agent, or Firm* — Winston Hsu

(57) ABSTRACT

A method for fabricating high electron mobility transistor (HEMT) includes the steps of: forming a buffer layer on a substrate; forming a barrier layer on the buffer layer; forming a hard mask on the barrier layer; performing an implantation process through the hard mask to form a doped region in the barrier layer and the buffer layer; removing the hard mask and the barrier layer to form a first trench; forming a gate dielectric layer on the hard mask and into the first trench; forming a gate electrode on the gate dielectric layer;
(Continued)

and forming a source electrode and a drain electrode adjacent to two sides of the gate electrode.

8 Claims, 5 Drawing Sheets

Related U.S. Application Data division of application No. 16/533,812, filed on Aug. 7, 2019, now Pat. No. 11,264,492.

(51) Int. Cl.
| | | |
|---|---|---|
| H01L 29/20 | (2006.01) | |
| *H01L 29/205* | (2006.01) | |
| *H01L 29/207* | (2006.01) | |
| *H01L 29/778* | (2006.01) | |
| H01L 21/28 | (2006.01) | |
| H01L 29/417 | (2006.01) | |
| H01L 29/423 | (2006.01) | |

(52) U.S. Cl.
CPC .......... *H01L 29/205* (2013.01); *H01L 29/207* (2013.01); *H01L 29/66462* (2013.01); *H01L 21/2654* (2013.01); *H01L 21/28264* (2013.01); *H01L 29/41766* (2013.01); *H01L 29/4236* (2013.01)

(56) References Cited

U.S. PATENT DOCUMENTS

| | | | |
|---|---|---|---|
| 9,728,470 B1 | 8/2017 | Heider | |
| 10,084,074 B1 | 9/2018 | Yang | |
| 10,388,753 B1 | 8/2019 | Armstrong | |
| 10,629,681 B2 | 4/2020 | Mishra | |
| 10,790,375 B2 | 9/2020 | Yao | |
| 10,892,358 B1 | 1/2021 | Chang | |
| 11,264,492 B2* | 3/2022 | Huang | H01L 29/207 |
| 11,804,544 B2* | 10/2023 | Huang | H01L 29/7786 |
| 2006/0060871 A1 | 3/2006 | Beach | |
| 2007/0114569 A1* | 5/2007 | Wu | H01L 29/207 |
| | | | 257/E29.093 |
| 2007/0249119 A1 | 10/2007 | Saito | |
| 2010/0258843 A1 | 10/2010 | Lidow | |
| 2011/0089467 A1 | 4/2011 | Chang | |
| 2011/0263102 A1 | 10/2011 | Heikman | |
| 2012/0313106 A1 | 12/2012 | He | |
| 2013/0175539 A1 | 7/2013 | Choi | |
| 2013/0256679 A1 | 10/2013 | Yao | |
| 2013/0264579 A1 | 10/2013 | Bridger | |
| 2013/0320349 A1 | 12/2013 | Saunier | |
| 2014/0042446 A1 | 2/2014 | Chiang | |
| 2014/0091364 A1 | 4/2014 | Imanishi | |
| 2014/0273482 A1 | 9/2014 | Tsuchiya | |
| 2014/0346525 A1 | 11/2014 | Minoura | |
| 2014/0353722 A1 | 12/2014 | Zhang | |
| 2015/0255547 A1 | 9/2015 | Yuan | |
| 2015/0303291 A1 | 10/2015 | Makiyama | |
| 2015/0349064 A1 | 12/2015 | Azize | |
| 2015/0349124 A1 | 12/2015 | Lu | |
| 2016/0190294 A1 | 6/2016 | Okamoto | |
| 2016/0293723 A1 | 10/2016 | Chiu | |
| 2017/0025507 A1 | 1/2017 | Fan | |
| 2017/0170306 A1 | 6/2017 | Nakayama | |
| 2017/0271492 A1 | 9/2017 | Chiu | |
| 2017/0309712 A1 | 10/2017 | Yamada | |
| 2017/0345812 A1 | 11/2017 | Chou | |
| 2017/0345921 A1 | 11/2017 | Feng | |
| 2018/0069090 A1 | 3/2018 | Morancho | |
| 2018/0158940 A1 | 6/2018 | Shibib | |
| 2018/0175186 A1 | 6/2018 | Chen | |
| 2018/0294341 A1* | 10/2018 | Chen | H01L 29/42376 |
| 2018/0350944 A1 | 12/2018 | Huang | |
| 2018/0358431 A1 | 12/2018 | Kagawa | |
| 2019/0097001 A1 | 3/2019 | LaRoche | |
| 2019/0206994 A1 | 7/2019 | Huang | |
| 2019/0206998 A1 | 7/2019 | Huang | |
| 2019/0207012 A1 | 7/2019 | Lin | |
| 2019/0207019 A1 | 7/2019 | Tsai | |
| 2019/0221660 A1 | 7/2019 | Dasgupta | |
| 2019/0237588 A1 | 8/2019 | Mudholkar | |
| 2019/0280111 A1 | 9/2019 | Shimizu | |
| 2019/0393210 A1 | 12/2019 | Then | |
| 2020/0020681 A1 | 1/2020 | Boles | |
| 2020/0219772 A1 | 7/2020 | Ramaswamy | |
| 2020/0227407 A1 | 7/2020 | Radosavljevic | |
| 2020/0227469 A1 | 7/2020 | Then | |
| 2020/0227470 A1 | 7/2020 | Then | |
| 2020/0227544 A1 | 7/2020 | Then | |
| 2020/0227545 A1 | 7/2020 | Then | |
| 2020/0373407 A1* | 11/2020 | Shih | H01L 21/76224 |

FOREIGN PATENT DOCUMENTS

| | | |
|---|---|---|
| WO | 2007/116238 | 10/2007 |
| WO | 2018/004660 | 1/2018 |

OTHER PUBLICATIONS

Chen et al., "Self-aligned Enhancement-mode AlGaN/GaN HEMTs Using 25 keV Fluorine Ion Implantation", IEEE, 2010, pp. 137-138, 2010.

Hongwei Chen et al., Enhancement-mode AlGaN/GaN HEMTs Fabricated by Standard Fluorine Ion Implantation, CS MANTECH Conference, May 2010, pp. 145-148. , 2010.

Hongwei Chen et al., Enhancement-Mode AlGaN/GaN HEMTs Fabricated by Standard Fluorine Ion Implantation with a Si3N4 Energy-Absorbing Layer, Electrochemical and Solid-State Letters, vol. 14, No. 6, Mar. 14, 2011, cover letter + pp. H229-H231. , 2011.

Yong Cai et al., Control of Threshold Voltage of AlGaN/GaN HEMTs by Fluoride-Based Plasma Treatment: From Depletion Mode to Enhancement Mode, IEEE Transactions on Electron Devices, vol. 53, No. 9, Sep. 2006, pp. 2207-2215. , 2006.

Yong Cai et al., Monolithically Integrated Enhancement/Depletion-Mode AlGaN/GaN HEMT Inverters and Ring Oscillators Using CF4 Plasma Treatment, IEEE Transactions on Electron Devices, vol. 53, No. 9, Sep. 2006, pp. 2223-2230. , 2006.

Maojun Wang et al., Source Injection Induced Off-State Breakdown and Its Improvement by Enhanced Back Barrier with Fluorine Ion Implantation in AlGaN/GaN HEMTs, 2008 IEEE International Electron Devices Meeting, Dec. 2008, pp. 1-4. , 2008.

* cited by examiner

HIGH ELECTRON MOBILITY TRANSISTOR AND METHOD FOR FABRICATING THE SAME

CROSS REFERENCE TO RELATED APPLICATIONS

This application is a continuation application of U.S. application Ser. No. 17/575,655, filed on Jan. 14, 2022, now U.S. Pat. No. 11,804,544, issued Oct. 31, 2023, which is a division of U.S. application Ser. No. 16/533,812, filed on Aug. 7, 2019, now U.S. Pat. No. 11,264,492, issued Mar. 1, 2022. The contents of these applications are incorporated herein by reference.

BACKGROUND OF THE INVENTION

1. Field of the Invention

The invention relates to a high electron mobility transistor (HEMT) and method for fabricating the same.

2. Description of the Prior Art

High electron mobility transistor (HEMT) fabricated from GaN-based materials have various advantages in electrical, mechanical, and chemical aspects of the field. For instance, advantages including wide band gap, high break down voltage, high electron mobility, high elastic modulus, high piezoelectric and piezoresistive coefficients, and chemical inertness. All of these advantages allow GaN-based materials to be used in numerous applications including high intensity light emitting diodes (LEDs), power switching devices, regulators, battery protectors, display panel drivers, and communication devices.

SUMMARY OF THE INVENTION

According to an embodiment of the present invention, a method for fabricating high electron mobility transistor (HEMT) includes the steps of: forming a buffer layer on a substrate; forming a barrier layer on the buffer layer; forming a hard mask on the barrier layer; performing an implantation process through the hard mask to form a doped region in the barrier layer and the buffer layer; removing the hard mask and the barrier layer to form a first trench; forming a gate dielectric layer on the hard mask and into the first trench; forming a gate electrode on the gate dielectric layer; and forming a source electrode and a drain electrode adjacent to two sides of the gate electrode.

According to another aspect of the present invention, a high electron mobility transistor (HEMT) includes: a buffer layer on a substrate; a barrier layer on the buffer layer; a gate electrode on the barrier layer; a gate dielectric layer between the barrier layer and the gate electrode; a hard mask between the gate dielectric layer and the barrier layer; and a source electrode and a drain electrode adjacent to two sides of the gate electrode on the buffer layer.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
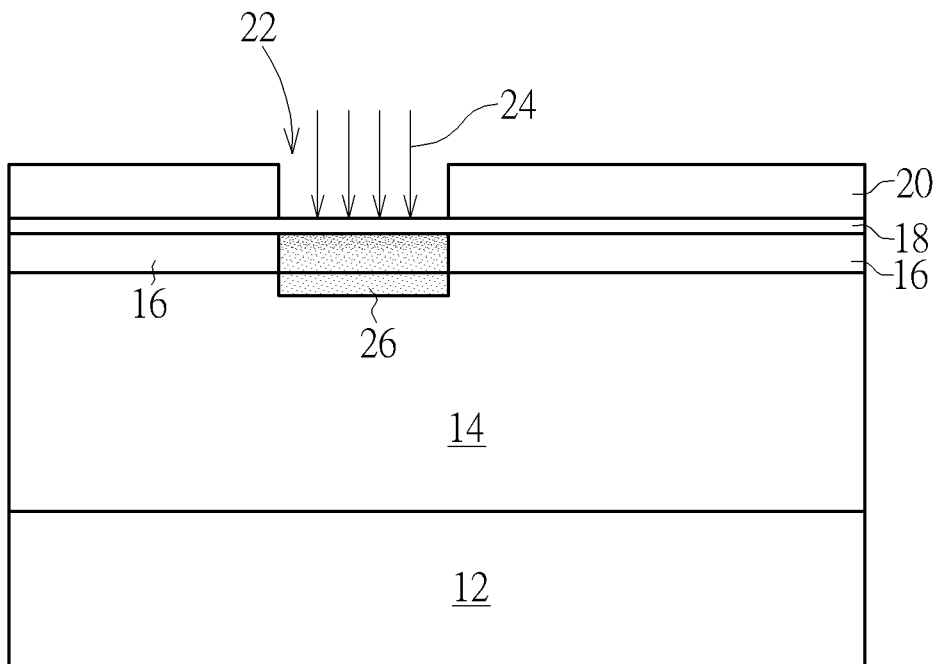
FIGS. 1-5 illustrate a method for fabricating a HEMT according to an embodiment of the present invention.

Referring to the FIGS. 1-5, FIGS. 1-5 illustrate a method for fabricating a HEMT according to an embodiment of the present invention. As shown in the FIG. 1, a substrate 12 such as a substrate made from silicon, silicon carbide, or aluminum oxide (or also referred to as sapphire) is provided, in which the substrate 12 could be a single-layered substrate, a multi-layered substrate, gradient substrate, or combination thereof. According to other embodiment of the present invention, the substrate 12 could also include a silicon-on-insulator (SOI) substrate.

Next, a buffer layer 14 is formed on the substrate 12. According to an embodiment of the present invention, the buffer layer 14 is preferably made of III-V semiconductors such as gallium nitride (GaN), in which a thickness of the buffer layer 14 could be between 0.5 microns to 10 microns. According to an embodiment of the present invention, the formation of the buffer layer 14 could be accomplished by a molecular-beam epitaxy (MBE) process, a metal organic chemical vapor deposition (MOCVD) process, a chemical vapor deposition (CVD) process, a hydride vapor phase epitaxy (HVPE) process, or combination thereof.

Next, a barrier layer 16 is formed on the surface of the buffer layer 14. In this embodiment, the barrier layer 16 is preferably made of III-V semiconductor such as aluminum gallium nitride ($Al_xGa_{1-x}N$), in which $0<x<1$ and the barrier layer 16 preferably includes an epitaxial layer formed through epitaxial growth process. Similar to the buffer layer 14, the formation of the barrier layer 16 on the buffer layer 14 could be accomplished by a molecular-beam epitaxy (MBE) process, a metal organic chemical vapor deposition (MOCVD) process, a chemical vapor deposition (CVD) process, a hydride vapor phase epitaxy (HVPE) process, or combination thereof.

Next, a hard mask 18 is formed on the barrier layer 16 to cover the surface of the barrier layer 16 entirely, and a patterned mask 20 such as a patterned resist is formed on the hard mask 18, in which the patterned mask 20 includes an opening 22 exposing part of the hard mask 18 surface. Next, an ion implantation process 24 is conducted by using the patterned mask 20 as mask to inject fluorine ions into the barrier layer 16 and the buffer layer 14 through the hard mask 18. This forms a doped region 26 in the barrier layer 16 and the buffer layer 14. In this embodiment, the bottom or bottommost surface of the doped region 26 preferably made of fluorine is slightly lower than the bottom surface of the barrier layer 16 or the top surface of the buffer layer 14 and the concentration of fluorine within the doped region 26 preferably decreases from barrier layer 16 toward the buffer layer 14. In other words, the doped region 26 closer to the boundary between the barrier layer 16 and the hard mask 18 preferably includes higher concentration of fluorine ions while the doped region 26 closer to the boundary between the barrier layer 16 and the buffer layer 14 includes lower concentration of fluorine ions.

Figure 2:
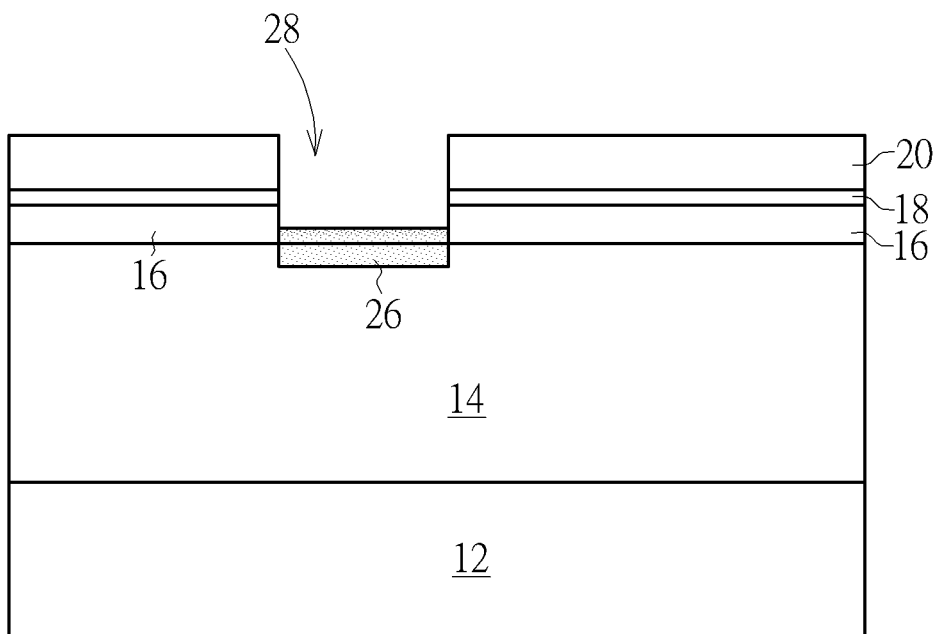
Figure 7:
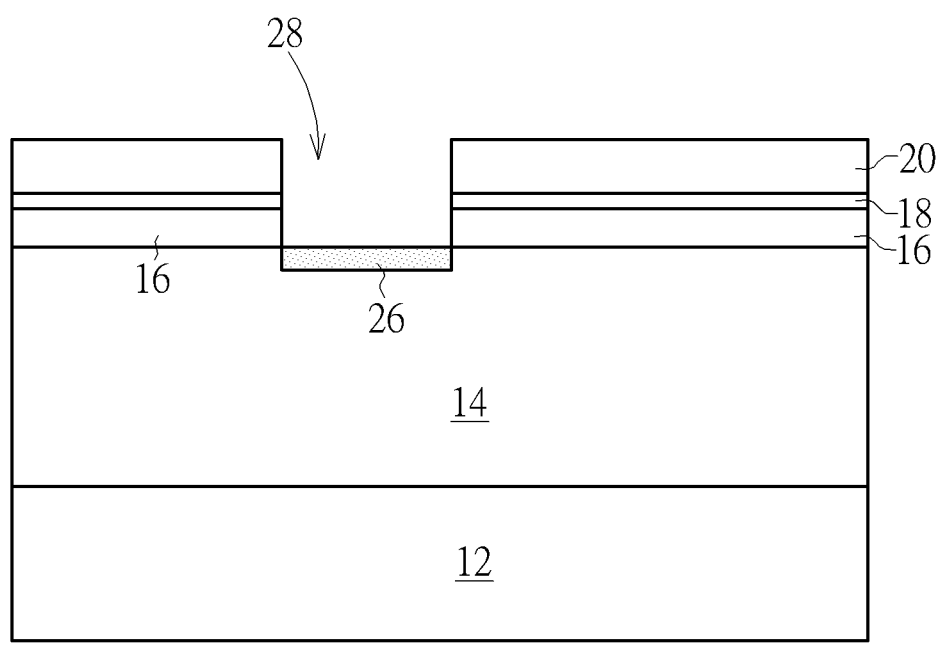
FIG. 7 illustrates a method for fabricating a HEMT according to an embodiment of the present invention.

Next, as shown in FIG. 2, an etching process is conducted by using the patterned mask 20 as mask to remove part of the hard mask 18 and part of the barrier layer 16 to form a trench 28, in which the etching process only removes part of the doped region 26 so that part of the doped region 26 still remains directly under the trench 28. In this embodiment, the bottom surface of the trench 28 is slightly higher than the bottom surface of the barrier layer 16. Nevertheless, according to other embodiment of the present invention, it would also be desirable to adjust the depth of the trench 28 so that the bottom surface of the trench 28 could be higher than, even with (as shown in FIG. 7), or even lower than the bottom surface of the barrier layer 16 or the top surface of the buffer layer 14, which are all within the scope of the present invention.

Figure 3:
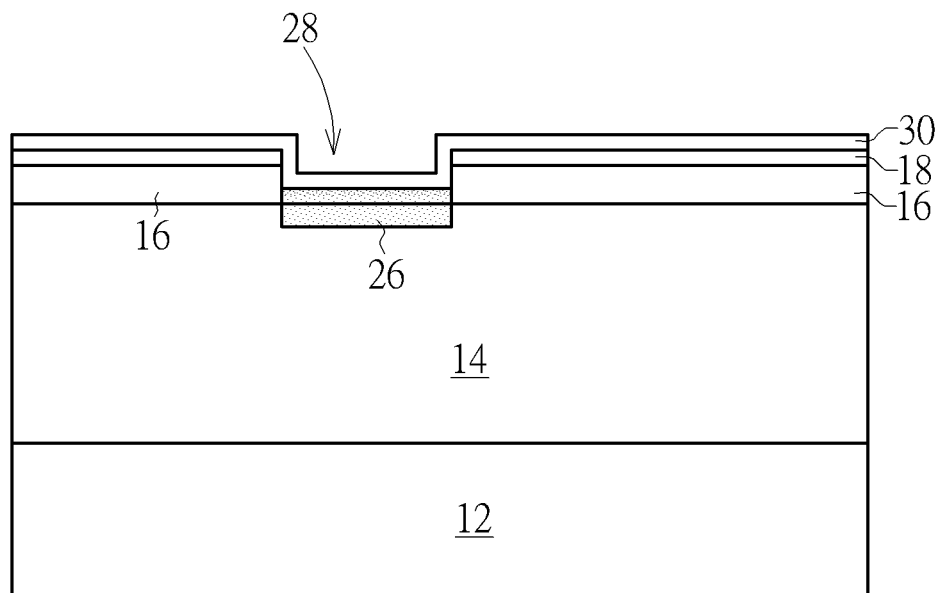

Next, as shown in FIG. 3, a gate dielectric layer 30 is formed on the hard mask 18 and into the trench 28 without filling the trench 28 completely. In this embodiment, the gate dielectric layer 30 is preferably made of metal nitrides such as aluminum nitride (AlN) but could also other dielectric material including but not limited to for example silicon oxide ($SiO_2$), silicon nitride (SiN), a high-k dielectric layer, or combination thereof, in which the high-k dielectric layer could be selected from dielectric materials having dielectric constant (k value) larger than 4. For instance, the high-k dielectric layer may be selected from hafnium oxide ($HfO_2$), hafnium silicon oxide ($HfSiO_4$), hafnium silicon oxynitride (HfSiON), aluminum oxide ($Al_2O_3$), lanthanum oxide ($La_2O_3$), tantalum oxide ($Ta_2O_5$), yttrium oxide ($Y_2O_3$), zirconium oxide ($ZrO_2$), strontium titanate oxide ($SrTiO_3$), zirconium silicon oxide ($ZrSiO_4$), hafnium zirconium oxide ($HfZrO_4$), strontium bismuth tantalate ($SrBi_2Ta_2O_9$, SBT), lead zirconate titanate ($PbZr_xTi_{1-x}O_3$, PZT), barium strontium titanate ($Ba_xSr_{1-x}TiO_3$, BST) or a combination thereof.

Figure 4:
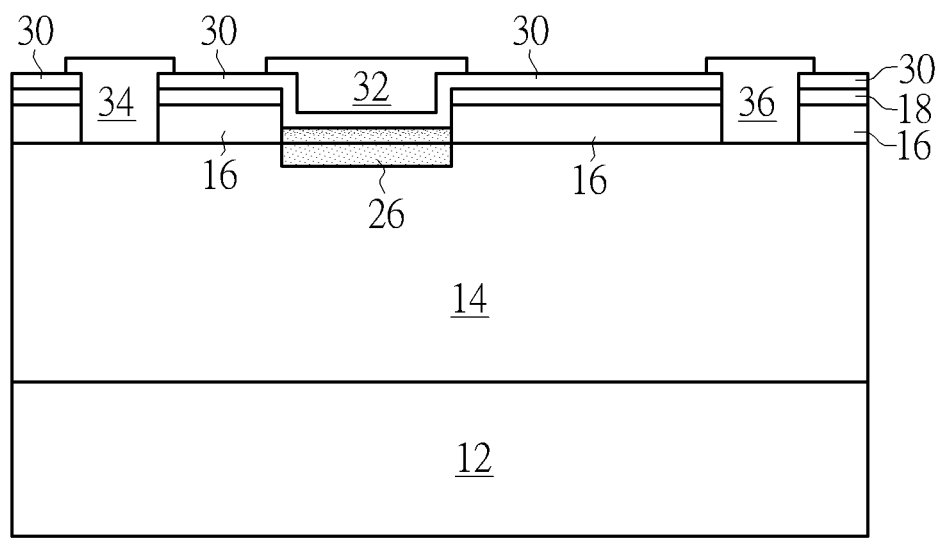

Next, as shown in FIG. 4, a photo-etching process is conducted to remove part of the gate dielectric layer 30, part of the hard mask 18, and part of the barrier layer 16 adjacent to two sides of the trench 28 for forming two trenches (not shown), and then a gate electrode 32 is formed in the trench 28 and a source electrode 34 and a drain electrode 36 are formed in the two trenches adjacent to two sides of the gate electrode 32 respectively.

In this embodiment, the gate electrode 32, the source electrode 34, and the drain electrode 36 are all made of metal material, in which the source electrode 34 and drain electrode 36 are preferably made of same material while the source electrode 34 and the drain electrode 36 and the gate electrode 32 could be made of same material or different materials. According to an embodiment of the present invention, each of the gate electrode 32, source electrode 34 and drain electrode 36 could include gold (Au), silver (Ag), platinum (Pt), titanium (Ti), aluminum (Al), tungsten (W), palladium (Pd), or combination thereof. According to other embodiments of the present invention, it would be desirable to conduct an electroplating process, sputtering process, resistance heating evaporation process, electron beam evaporation process, physical vapor deposition (PVD) process, chemical vapor deposition (CVD) process, or combination thereof to form an electrode material in the aforementioned trench and on the surface of the hard mask 30, and then pattern the electrode material through single or multiple etching processes to form the gate electrode 32, the source electrode 34, and the drain electrode 36 respectively.

Figure 5:
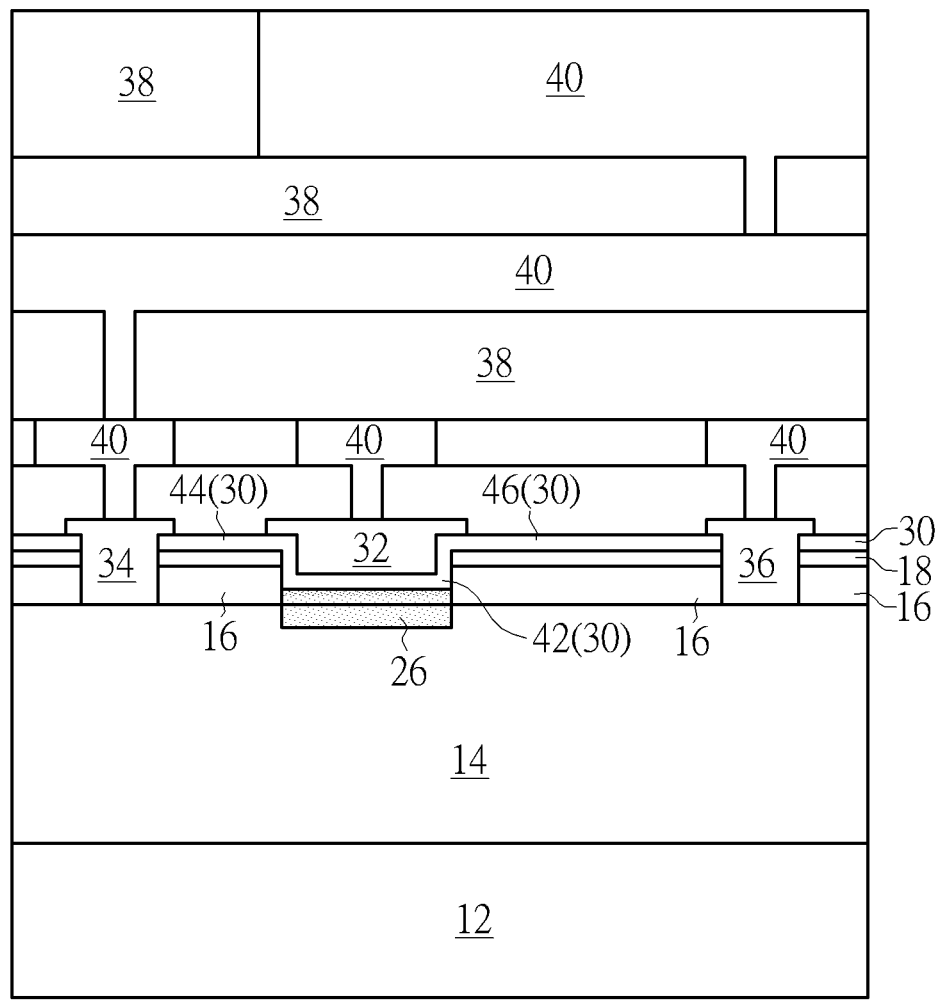

Next, as shown in FIG. 5, a metal interconnect process is conducted to form multiple inter-metal dielectric (IMD) layers 38 and metal interconnections 40 embedded in the IMD layers 38 to electrically connect the gate electrode 32, source electrode 34, and drain electrode 36. In this embodiment, each of the metal interconnections 40 within the metal interconnect structure could be fabricated according to a single damascene or dual damascene process and electrically connected to each other. Preferably, each of the metal interconnections 40 could further include a barrier layer selected from the group consisting of titanium (Ti), titanium nitride (TiN), tantalum (Ta), and tantalum nitride (TaN) and a metal layer selected from the group consisting tungsten (W), copper (Cu), aluminum (Al), titanium aluminide (TiAl) alloy, and cobalt tungsten phosphide (CoWP). Since single damascene and dual damascene are well known to those skilled in the art, the details of which are not explained herein for the sake of brevity.

Referring to FIG. 5, FIG. 5 further illustrates a structural view of a HEMT according to an embodiment of the present invention. As shown in FIG. 5, the HEMT preferably includes a buffer layer 14 disposed on the substrate 12, a buffer layer 16 disposed on the barrier layer 14, a gate electrode 32 disposed on the barrier layer 16, a gate dielectric layer 30 disposed between the barrier layer 16 and the gate electrode 32, a hard mask 18 disposed between the gate dielectric layer 30 and the barrier layer 16, a doped region 26 disposed between gate dielectric layer 30 and the buffer layer 14, and a source electrode 34 and drain electrode 36 disposed on the buffer layer 14 adjacent to two sides of the gate electrode 32.

In this embodiment, the buffer layer 14 preferably includes III-V semiconductors such as gallium nitride (GaN), the barrier layer 16 preferably includes III-V semiconductor such as aluminum gallium nitride ($Al_xGa_{1-x}N$), and the hard mask 18 and the gate dielectric layer 30 are preferably made of different materials, in which the hard mask 18 preferably includes silicon nitride (SiN) but could also include other dielectric materials including but not limited to for example silicon oxide, silicon oxynitride (SiON), or silicon carbon nitride (SiCN), and the gate dielectric layer 30 preferably includes metal nitrides such as aluminum nitride (AlN) but could also include other dielectric material including but not limited to for example silicon oxide ($SiO_2$), silicon nitride (SiN), a high-k dielectric layer, or combination thereof. The doped region 26 preferably includes fluorine and the concentration of fluorine within the doped region 26 preferably decreases from barrier layer 16 toward the buffer layer 14. In other words, the doped region 26 closer to the boundary between the barrier layer 16 and the hard mask 18 preferably includes higher concentration of fluorine ions while the doped region 26 closer to the boundary between the barrier layer 16 and the buffer layer 14 includes lower concentration of fluorine ions.

Viewing from a more detailed perspective, the gate dielectric layer 30 preferably includes a U-shape 42 or U-shaped portion and a first horizontal portion 44 and second horizontal portion 46 connecting the U-shape 42, in which the hard mask 18 is disposed between the first horizontal portion 44 and the barrier layer 16 and the second horizontal portion 46 and the barrier layer 16. Preferably, the source electrode 34 and drain electrode 36 contact the gate dielectric layer 30 and the hard mask 18 directly, the top surfaces of the source electrode 34, drain electrode 36, and gate electrode 32 coplanar while the bottom surfaces of the source electrode 34 and drain electrode 36 are slightly lower than the bottom surface of the gate electrode 32, and a sidewall or sidewalls of the hard mask 18 is aligned with sidewalls of the doped region 26 under the source electrode 34 and drain electrode 36. It should be noted that even though the bottom surfaces of the source electrode 34 and drain electrode 36 are even with the bottom surface of the barrier layer 16, according to other embodiments of the present the bottom surfaces of the source electrode 34 and drain electrode 36 could also be slightly higher than or lower than the bottom surface of the barrier layer 16, which are all within the scope of the present invention.

Figure 6:
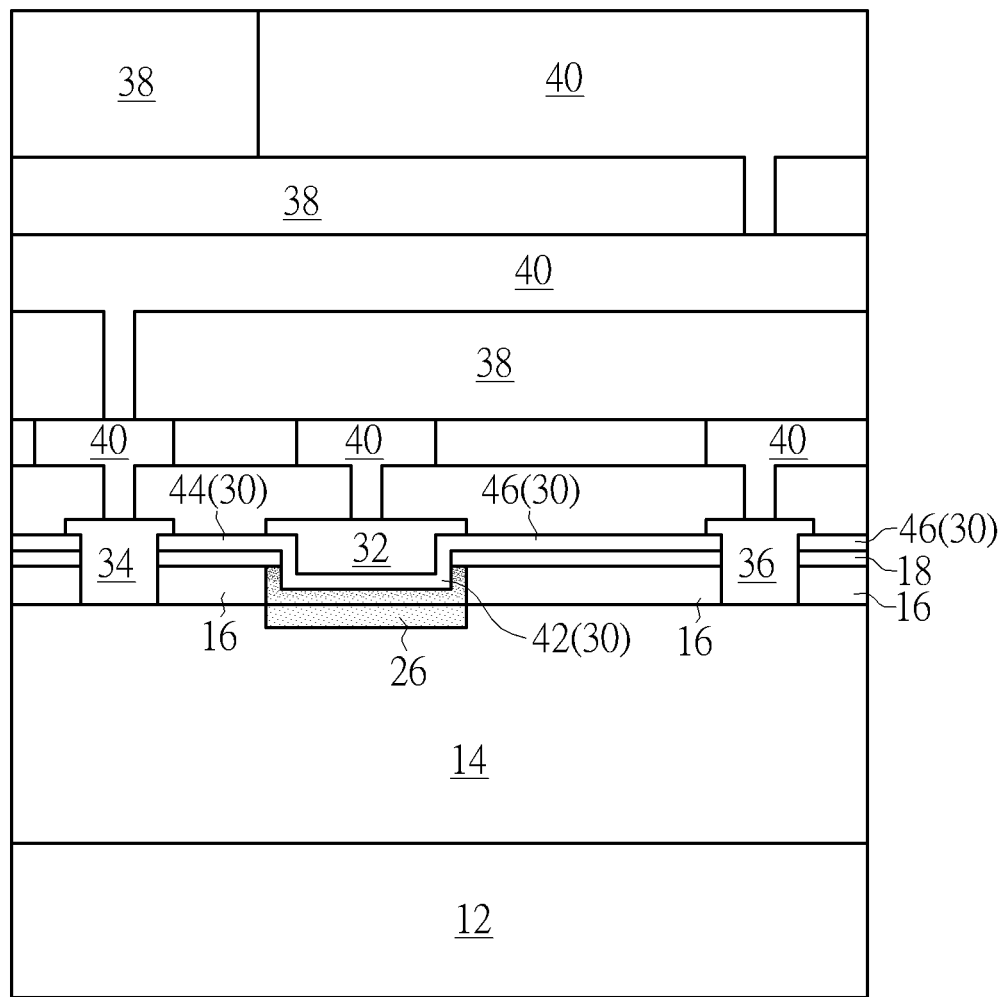
FIG. 6 illustrates a structural view of a HEMT according to an embodiment of the present invention.

Referring to FIG. 6, FIG. 6 illustrates a structural view of a HEMT according to an embodiment of the present invention. As shown in FIG. 6, in contrast to sidewalls of the gate dielectric layer being aligned with sidewalls of the doped region underneath as disclosed in the aforementioned embodiment, according to an embodiment of the present invention it would also be desirable to conduct a tilt-angle ion implantation process to inject fluorine ions into the barrier layer 16 and buffer layer 14 or use two patterned masks having different widths to form the doped region 26 and the trench 28 separately so that the width of the trench 28 is slightly less than the width of the doped region 26. Accordingly, a U-shaped doped region 26 would then formed to surround the bottom of the gate dielectric layer 30 and gate electrode 32 after the gate dielectric layer 30 and gate electrode 32 are formed, which is also within the scope of the present invention.

Typically, a heterojunction is formed at the interface between the buffer layer and barrier layer as a result of the bandgap difference between the two layers. Essentially a quantum well is formed in the banding portion of the conduction band of the heterojunction to constrain the electrons generated by piezoelectricity so that a channel region or two-dimensional electron gas (2 DEG) is formed at the junction between the buffer layer and barrier layer to form conductive current.

Conventional approach of switching a Normally-on operation to a Normally-off operation in HEMT could be accomplished by first forming a hard mask on the barrier layer, patterning the hard mask to form an opening exposing the surface of the barrier layer, and then injecting fluorine ions directly into the barrier layer through ion implantation, in which the injected fluorine ions preferably attract free electrons and then become negative fixed charged for adjusting local potentials thereby depleting 2 DEG. Since the doped region formed by implanting ions directly into the barrier layer in current process often includes an excessive depth thereby affecting resistance of the device, the present invention preferably injects fluorine ions into the barrier layer and buffer layer through the hard mask preferably made of silicon nitride without removing or patterning the hard mask. By using the hard mask as a barrier or buffer structure it would be desirable to eliminate the use of additional mask for patterning the hard mask and also prevent the doped region formed from having excessive depth to affect the performance of the device.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A method for fabricating high electron mobility transistor (HEMT), comprising:
    forming a buffer layer on a substrate;
    forming a barrier layer on the buffer layer;
    forming a hard mask on the barrier layer;
    performing an ion implantation process through the hard mask to form a doped region in the barrier layer and the buffer layer; and
    removing a portion of the hard mask and a portion of the barrier layer to form a first trench, wherein a width of the first trench is less than a width of the doped region.

2. The method of claim 1, further comprising:
    forming a gate dielectric layer on the hard mask and into the first trench;
    forming a gate electrode on the gate dielectric layer; and
    forming a source electrode on a first side of the gate electrode and a drain electrode on a second side of the gate electrode, the first side being opposite the second side.

3. The method of claim 2, further comprising:
    removing the gate dielectric layer, the hard mask, and the barrier layer to form a second trench and a third trench adjacent to two sides of the gate electrode; and
    forming the source electrode in the second trench and the drain electrode in the third trench.

4. The method of claim 1, wherein the buffer layer comprises a group III-V semiconductor.

5. The method of claim 1, wherein the buffer layer comprises gallium nitride (GaN).

6. The method of claim 1, wherein the barrier layer comprise $Al_xGa_{1-x}N$.

7. The method of claim 1, wherein the doped region comprises fluorine.

8. The method of claim 7, wherein a concentration of fluorine decreases from the barrier layer to the buffer layer.

* * * * *